(12) United States Patent
Pyo

(10) Patent No.: US 7,041,566 B2
(45) Date of Patent: May 9, 2006

(54) METHOD FOR FORMING INDUCTOR IN SEMICONDUCTOR DEVICE

(75) Inventor: Sung Gyu Pyo, Yongin-Shi (KR)

(73) Assignee: Hynix Semiconductor Inc., Icheon-Shi (KR)

( * ) Notice: Subject to any disclaimer, the term of this patent is extended or adjusted under 35 U.S.C. 154(b) by 109 days.

(21) Appl. No.: 10/878,314

(22) Filed: Jun. 29, 2004

(65) Prior Publication Data

US 2005/0130423 A1    Jun. 16, 2005

(30) Foreign Application Priority Data

Dec. 15, 2003    (KR) .................... 10-2003-0091666

(51) Int. Cl.
*H01L 21/4763* (2006.01)

(52) U.S. Cl. .................. 438/381; 438/631; 438/742; 438/21; 438/331

(58) Field of Classification Search ................ 438/381, 438/631, 742
See application file for complete search history.

(56) References Cited

U.S. PATENT DOCUMENTS

| 6,429,764 | B1 * | 8/2002 | Karam et al. | 336/200 |
| 2003/0157805 | A1 * | 8/2003 | Schultz et al. | 438/694 |
| 2005/0070090 | A1 * | 3/2005 | Lee et al. | 438/629 |
| 2005/0074976 | A1 * | 4/2005 | Kim | 438/692 |

* cited by examiner

*Primary Examiner*—Matthew Smith
*Assistant Examiner*—Lex H. Malsawma
(74) *Attorney, Agent, or Firm*—Mayer, Brown, Rowe & Maw LLP

(57) ABSTRACT

The present invention relates to a method for forming an inductor in a semiconductor device. The method comprises the steps of forming a first metal layer on a semiconductor substrate in which a predetermined structure is formed, and then patterning the first metal layer so that a predetermined region of the semiconductor substrate is exposed; forming a first copper layer on the entire resulting surface and then polishing the first copper layer; forming a second metal layer on the resulting surface including the polished first copper layer and then patterning the second metal layer so that predetermined regions of the first metal layer and the first copper layer are exposed; forming a second copper layer on the formed resulting surface; and polishing the resulting surface and stripping the first and second metal layers.

10 Claims, 3 Drawing Sheets

METHOD FOR FORMING INDUCTOR IN SEMICONDUCTOR DEVICE

BACKGROUND

1. Field of the Invention

The present invention relates to a method for manufacturing a semiconductor device, and more specifically, to a method for forming an inductor in a semiconductor device.

2. Discussion of Related Art

An inductor being a passive device in RFCMOS, Bipolor/SiGe, BiCMOS semiconductor devices is formed by means of a damascene process as the devices are higher integrated.

A conventional method for forming an inductor in a semiconductor device will now be described with reference to FIG. 1A to FIG. 1C.

FIG. 1A to FIG. 1C are cross-sectional views for explaining a conventional method for forming an inductor in a semiconductor device.

Referring to FIG. 1A, an interlayer insulating film 12 is formed on a semiconductor substrate 11 in which a predetermined structure is formed. A photoresist pattern (not shown) is formed on the interlayer insulating film 12 and is then etched using an etch mask, thus forming a trench through which a predetermined region of a semiconductor substrate 11 is exposed.

By reference to FIG. 1B, an anti-diffusion film 14 and a copper seed layer 16 are formed on the entire structure. A copper layer 18 is then formed by means of an electroplating process, thus filling the trench. At this time, an electroplating process is implemented using a chemical catalyst.

Referring to FIG. 1C, the copper layer 18, the copper seed layer 16 and the anti-diffusion film 14 are polished by means of a polishing process such as a CMP process, so that a copper layer 18 of the inductor is formed.

Recently, as the degree of integration in semiconductor devices is increased, copper (Cu) has been widely used as a material of the inductor 18. In order to facilitate the use of copper, a damascene process is also used as described above. In order to obtain desired quality factors of the copper inductor 18, Cu lines of several μm in thickness are required. If theses copper inductor lines are implemented by means of the damascene process, there are difficulties in each process as follows.

Firstly, a thickness of an insulating film used in a typical semiconductor process is about 1 μm. The inductor 18, however, has to be formed in thickness of 2~3 μm or more, i.e., the interlayer insulating film 12 has to be formed in thickness of 2~3 μm or more. If the interlayer insulating film 12 is formed thickly as such, there are problems in the throughput of an apparatus, control of particles and stress and so on.

Secondly, an interlayer insulating film 12 having a thick thickness of 2~3 μm has to be etched in order to form a trench pattern a. Thus the manufacturing cost is increased due to increased throughput and lengthened etch time.

Thirdly, the trench a has to be filled by an electroplating method with the anti-diffusion film 14 and the seed layer 16 formed along the surface of the first insulating film 12. Accordingly, defects such as void or seam are generated at portions where the line width of the inductor 18 is narrow due to conformal filling, as shown in FIG. 1C. This makes stability of the process difficult.

Fourthly, the metal layer 18 has a very great step and is formed very thickly about 3 to 5 μm. Polishing this metal layer 18 through a chemical mechanical polishing process is very difficult and requires lots of time, which adversely affects productivity and cost. Therefore, there is a problem that the cost unit is significantly increased.

SUMMARY OF THE INVENTION

Accordingly, the present invention has been made in view of the above problems, and it is an object of the present invention to provide a method for forming an inductor in a semiconductor device wherein a process step, a process cost, a process time, a process difficulty, etc. are reduced.

According to a preferred embodiment of the present invention, there is provided a method for forming an inductor in a semiconductor device, comprising the steps of: forming a first metal layer on a semiconductor substrate in which a predetermined structure is formed, and then patterning the first metal layer so that a predetermined region of the semiconductor substrate is exposed; forming a first copper layer on the entire resulting surface and then polishing the first copper layer; forming a second metal layer on the resulting surface including the polished first copper layer and then patterning the second metal layer so that predetermined regions of the first metal layer and the first copper layer are exposed; forming a second copper layer on the formed resulting surface; and polishing the resulting surface and stripping the first and second metal layers.

It is preferred that the first metal layer or the second metal layer is formed using one of nickel (Ni), cobalt (Co), titanium (Ti), aluminum (Al), tungsten (W), tin (Sn) and tantalum (Ta).

It is preferable that the first copper layer or the second copper layer is formed by means of an electroplating method or an electroless plating method using an additive-free plating solution.

It is preferred that the electroplating method using the additive-free plating solution is performed using a solution in which $H_2SO_4$ and $CuSO_4$ are mixed in the ratio of 1~99:1~99.

The electroplating method using the additive-free plating solution is preferably performed with the concentration of HCl kept 1 to 1000 ppm.

It is preferred that the electroplating method using the additive-free plating solution is performed using one of a forward DC plating method, a pulse-reverse plating method and a pulse plating method, or a multi-step plating method in which those methods are mixed.

It is preferable that the electroless plating method includes performing a process of adding a surface cleaning and activation agent.

The method preferably further includes the step of implementing an annealing process after the step of forming the second copper layer is performed.

It is preferable that the annealing process is performed at a temperature of 50 to 500° C. for 1 minute to 5 hours, and is performed under a hydrogen, argon, nitrogen or forming gas atmosphere.

It is preferred that the stripping of the first metal layer or the second metal layer is performed through a wet etch process.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate.

FIG. 2A to FIG. 2E are cross-sectional views for explaining a method for forming an inductor in a semiconductor device according to the present invention.

Figure 1A:
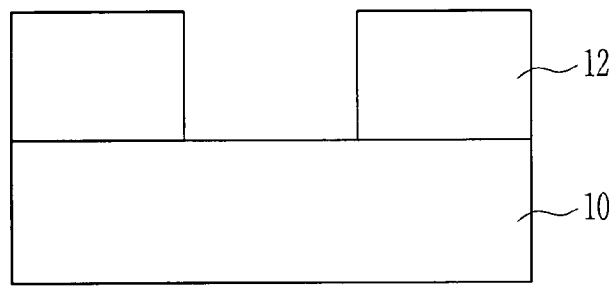
FIG. 1A to FIG. 1C are cross-sectional views for explaining a conventional method for forming an inductor in a semiconductor device.
Figure 1B:
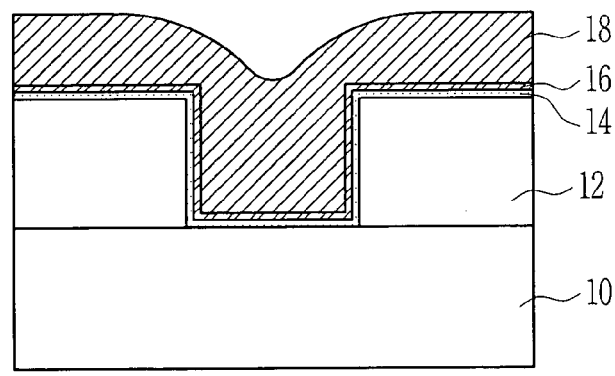
Figure 1C:
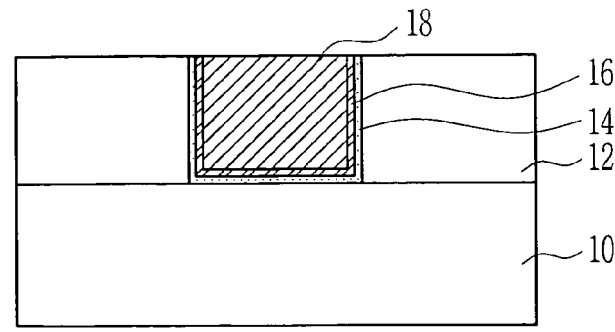
Figure 2A:
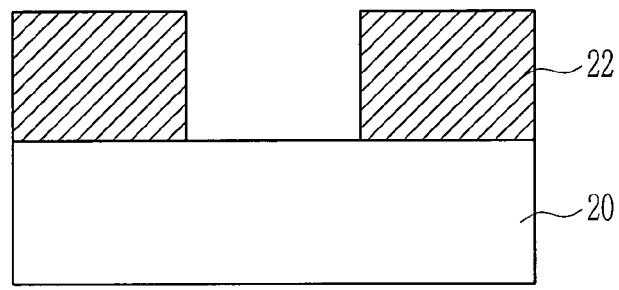
FIG. 2A to FIG. 2E are cross-sectional views for explaining a method for forming an inductor in a semiconductor device according to the present invention.

Referring to FIG. 2A, a first tin (Sn) layer 22 is formed on a semiconductor substrate 20 in which a predetermined structure, i.e., a CMOS device is formed. The first tin layer 22 is used as an air gap bridge. At this time, the first tin (Sn) layer is formed to have the height as high as a gap between an underlying element and an inductor to be formed on the top. Since the distance between the underlying element and the inductor is in range of 100~500 μm, the first tin (Sn) layer is also formed in thickness of that extent. The first tin layer 22 is experienced by a photolithography process, thus exposing a predetermined region of the semiconductor substrate.

The first tin layer 22 can be formed using any metal film, which can be deposited by means of a PVD method or a plating method, has a good selective etch property against a copper layer that will be used as an air gap bridge to be formed later and can be plated using a material to be used as an air gap. The first tin layer can be made of, for example Ni, Co, Ti, Al, W, Ta, or the like.

Figure 2B:
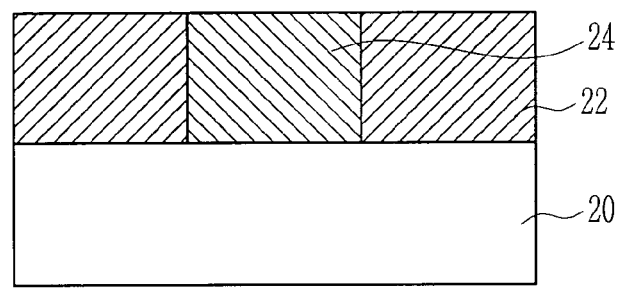

Referring to FIG. 2B, a first copper layer 24 is formed on the resulting surface in which the patterned first tin layer 22 is formed. The copper layer 24 is formed through an electroless plating method or an addictive-free electroplating method. The first copper layer 24 is used as the air gap bridge between the CMOS device and the inductor. The addictive-free electroplating method for forming the first copper layer 24 can employ a plating solution to which additives of polymer components such as a suppressor, an accelerator, a leveler, etc. are not added. Furthermore, the addictive-free electroplating method is performed using a plating solution in which $H_2SO_4$ and $CuSO_4$ are mixed in the ratio of 1~99:1~99.

Meanwhile, when the addictive-free electroplating method is used, HCl is also used. The concentration of HCl is 1~1000 ppm. Furthermore, the addictive-free electroplating method can be implemented using one of a forward DC plating method, a pulse-reverse plating method and a pulse plating method, or a multi-step plating method in which those methods are mixed. In addition, if the first copper layer 24 is formed by means of the electroless plating method, a process of adding a surface cleaning and activation agent can be added. Incidentally, in addition to the first copper layer, aluminum (Al) can be used. Thereafter, a polishing process such as a CMP process is performed for the formed resulting surface until the first tin layer 22 is exposed.

Figure 2C:
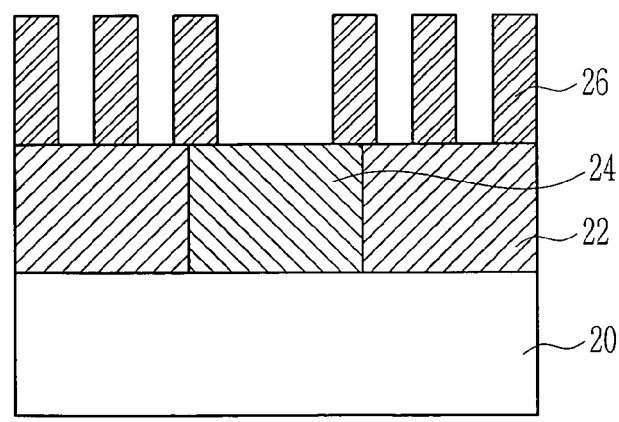

By reference to FIG. 2C, second tin layers 26 are formed on the entire structure. In the above, the second tin layers 26 are formed considering a thickness of an inductor. Like the first tin layer 22, the second tin layers 26 can be formed using all metals having a selective etch property against a copper layer and that can be formed using copper as a plating process, for example nickel (Ni), cobalt (Co), titanium (Ti), aluminum (Al), tungsten (W) and tantalum (Ta). Furthermore, the second tin layers 26 are patterned so that a portion of the first tin layer 22 and the first copper layer 24 underlying it are exposed depending on the number of winding of a desired inductor.

Figure 2D:
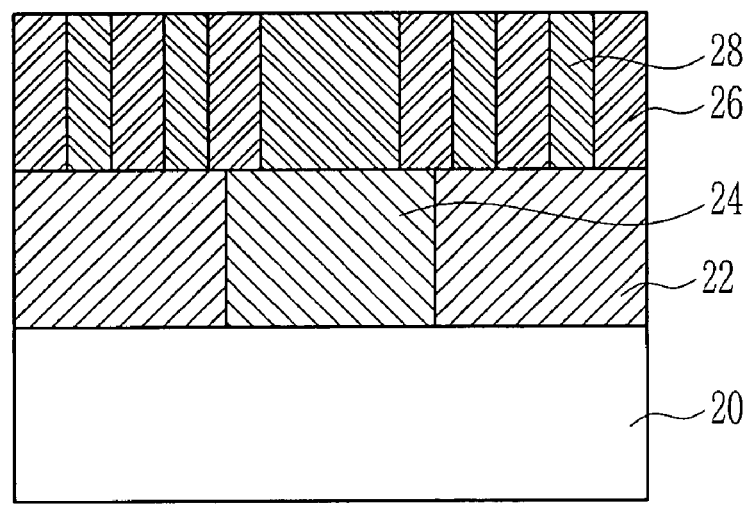

Referring to FIG. 2D, a second copper layer 28 is formed on the entire structure. The second copper layer 28 is formed by means of the same method as that for forming the first copper layer 24. An annealing process is performed for the resulting surface in which the formed second copper layer 28 is formed. At this time, the annealing process is performed at a temperature of 50~500° C. for 1 minute to 5 hours and is implemented in a hydrogen, argon, nitrogen or forming gas atmosphere. Thereafter, a polishing process such as a CMP process is performed so that the underlying second tin layer 26 is exposed, thus polishing the second copper layer 28.

Figure 2E:
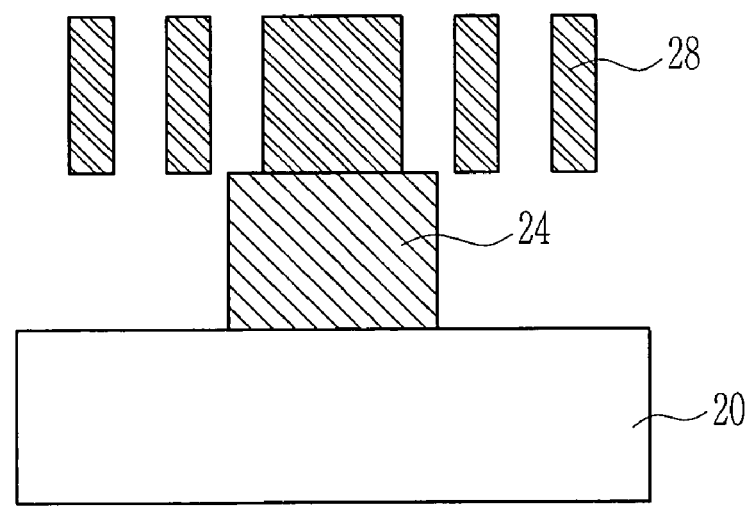

By reference to FIG. 2E, the formed first and second tin layers 22 and 26 are stripped to form an inductor of a RF-MEMS 3-D structure. The present process is thus completed. Stripping of the first and second tin layers can be carried out through a wet etch process.

Although the method for forming the 3-D inductor using RF-MEMS has been described in this embodiment, a RF-CMOS device having an inductor of a structure other than the 3-D structure can be used. The method for forming the air bridge in the 3-D inductor structure can be applied to implementation of the inductor of the RF-CMOS device.

According to the present invention described above, since copper is buried to form an inductor, processes for forming an anti-diffusion film and a seed layer that are necessary when copper is buried through a plating method are not required. Therefore, the number of the process can be significantly reduced and a copper line burial process is thus possible through simple equipment and low cost. Furthermore, it is possible to overcome difficulties in etching and a CMP process due to a high step. Cost necessary to form the inductor can be significantly reduced by shortening a CMP process time. Incidentally, since the process integration level is reduced and simplified, a 3-D inductor can be easily implemented. It is thus possible to develop a high-performance device having high fidelity required in communication devices, etc.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for forming an inductor in a semiconductor device, comprising the steps of:

forming a first metal layer on a semiconductor substrate in which a predetermined structure is formed, and then patterning the first metal layer so that a predetermined region of the semiconductor substrate is exposed;

forming a first copper layer on the entire resulting surface and then polishing the first copper layer;

forming a second metal layer on the resulting surface including the polished first copper layer and then patterning the second metal layer so that predetermined regions of the first metal layer and the first copper layer are exposed;

forming a second copper layer on the formed resulting surface; and polishing the resulting surface and stripping the first and second metal layers.

2. The method as claimed in claim 1, wherein the first metal layer or the second metal layer is formed using one of nickel (Ni), cobalt (Co), titanium (Ti), aluminum (Al), tungsten (W), tin (Sn) and tantalum (Ta).

3. The method as claimed in claim 1, wherein the first copper layer or the second copper layer is formed by means of an electroplating method or an electroless plating method using an additive-free plating solution.

4. The method as claimed in claim 3, wherein the electroplating method using the additive-free plating solution is performed using a solution in which $H_2SO_4$ and $CuSO_4$ are mixed in the ratio of 1~99:1~99.

5. The method as claimed in claim 3, wherein the electroplating method using the additive-free plating solution is performed with the concentration of HCl kept 1 to 1000 ppm.

6. The method as claimed in claim 3, wherein the electroplating method using the additive-free plating solution is performed using one of a forward DC plating method, a pulse-reverse plating method and a pulse plating method, or a multi-step plating method in which those methods are mixed.

7. The method as claimed in claim 3, wherein the electroless plating method includes performing a process of adding a surface cleaning and activation agent.

8. The method as claimed in claim 1, further comprising the step of implementing an annealing process after the step of forming the second copper layer is performed.

9. The method as claimed in claim 8, wherein the annealing process is performed at a temperature of 50 to 500° C. for 1 minute to 5 hours, and is performed in a hydrogen, argon, nitrogen or forming gas atmosphere.

10. The method as claimed in claim 1, wherein the stripping of the first metal layer or the second metal layer is performed through a wet etch process.

* * * * *